United States Patent [19]

Chang et al.

[11] Patent Number: 5,250,826
[45] Date of Patent: Oct. 5, 1993

[54] PLANAR HBT-FET DEVICE

[75] Inventors: Mau-Chung F. Chang, Thousand Oaks; Peter M. Asbeck, San Diego; Richard L. Pierson, Jr., Thousand Oaks, all of Calif.

[73] Assignee: Rockwell International Corporation, Seal Beach, Calif.

[21] Appl. No.: 949,901

[22] Filed: Sep. 23, 1992

[51] Int. Cl.$^5$ .............................................. H01L 29/72
[52] U.S. Cl. .................................... 257/273; 257/192; 257/197; 257/260; 257/279; 257/284; 257/586; 257/591
[58] Field of Search ............... 257/192, 197, 273, 279, 257/284, 586, 591

[56] References Cited

U.S. PATENT DOCUMENTS

| | | | |
|---|---|---|---|
| 4,821,090 | 4/1989 | Yokoyama | 257/273 |
| 5,027,170 | 6/1991 | Nishiguchi et al. | 257/284 |
| 5,068,756 | 11/1991 | Morris et al. | 257/273 |

OTHER PUBLICATIONS

K. Itakura, Y. Shimamoto, T. Ueda, S. Katsu, and D. Ueda, "A GaAs Bi-FET Technology for Large Scale Integration," *IEDM* 89, pp. 389-392 (IEEE, 1989).

*Primary Examiner*—Edward Wojciechowicz
*Attorney, Agent, or Firm*—John C. McFarren

[57] ABSTRACT

A III-V compound planar HBT-FET device integrates field effect transistors (FETs) with heterojunction bipolar transistors (HBTs) formed on the same semiconductor substrate. An HBT fabricated on the substrate includes a collector, a base, and an emitter. The HBT emitter comprises a lightly doped layer of a first conductivity type deposited atop a heavily doped base layer of a second conductivity type, a lightly doped emitter cap layer of the first conductivity type deposited atop the emitter layer, and a heavily doped emitter contact layer of the first conductivity type deposited atop the emitter cap layer. A FET, isolated from the HBT by areas of ion implantation, is formed in the layers of material deposited during fabrication of the HBT. The FET has a source and a drain formed in the heavily doped emitter contact layer, a gate recess etched in the emitter contact layer between the source and drain, and a Schottky gate metal contact deposited on the lightly doped emitter cap layer exposed in the gate recess. A back gate electrode can be deposited on the base layer to form a dual-gate FET comprising a front gate MESFET and a back gate junction FET. Connecting the back gate to an external power supply reduces backgating effects, provides radiation hardening, allows modulation of the back gate potential for tuning the threshold voltage of the FET, and provides for mixer-type applications with separate signals on the two gates.

13 Claims, 1 Drawing Sheet

PLANAR HBT-FET DEVICE

TECHNICAL FIELD

The present invention relates to III-V compound integrated circuits and, in particular, to a III-V semiconductor planar structure that integrates a heterojunction bipolar transistor (HBT) and a field effect transistor (FET) on the same chip.

BACKGROUND OF THE INVENTION

Metal semiconductor field effect transistors (MESFETs) integrated with heterojunction bipolar transistors (HBTs) on the same III-V semiconductor chip extend the capability of HBT circuits by providing: (1) high input impedance for amplifiers and sample-and-hold circuits; (2) low noise front ends; (3) active loads, which are particularly important in low power circuits: (4) current sources and sinks; and (5) low power random access memory (RAM) cells. Demonstrations of HBT-FET integration reported in the prior art have employed complex processes involving stacked structures and/or multiple epitaxial growths. At the present time, these processes have not advanced to actual circuit applications.

Prior art HBT-FET circuits formed by multilayer or selective area growth place severe demands on both material growth and device fabrication. Multilayer growth processes generally form non-planar devices. Conventional planar processes require a selective area regrowth of MESFET material on prepatterned HBT wafers. This regrowth of material requires additional processing steps and sophisticated cleaning procedures that lead to low yield and high cost fabrication. Thus there is a need for a planar III-V semiconductor structure that can be fabricated easily and inexpensively to provide the benefits of HBT-FET integration.

SUMMARY OF THE INVENTION

The present invention comprises a III-V compound planar device that integrates FETs with HBTs on the same semiconductor chip. Fabrication of the integrated HBT-FET device of the present invention (also termed a "BiFET") on a III-V semiconductor substrate requires only a small extension of the conventional HBT process. An HBT is formed on the substrate and includes a collector, a base, and an emitter. In an n-p-n GaAs HBT combined with an n-FET, for example, the HBT emitter comprises a lightly doped layer of AlGaAs deposited on top of a $p^+$ GaAs base layer, a lightly doped emitter cap layer of GaAs deposited on top of the AlGaAs layer, and a heavily doped emitter contact layer of InGaAs deposited on top of the GaAs cap layer. The n-FET, isolated from the HBT by areas of ion implantation, is constructed from the layers of material deposited to form the HBT emitter. The FET has a source and a drain formed in the heavily doped InGaAs layer, a gate recess etched in the InGaAs layer between the source and drain, and a Schottky gate metal contact deposited on the lightly doped GaAs layer exposed in the gate recess. A back gate electrode can connect the $p^+$ GaAs base layer of the FET to an external power supply. The result is a dual-gate FET having a front gate forming a metal semiconductor FET (MESFET) and a back gate forming a p-n FET. The back gate can be shorted to the source to enhance transconductance and to prevent unwanted modulation of FET threshold voltage and channel current caused by floating charge accumulation in the $p^+$ base layer. When connected to an external bias, the back gate reduces backgating effects, provides radiation hardening, and allows modulation of the back gate potential for tuning the threshold voltage of the FET.

A principal object of the invention is to integrate HBTs and FETs on a III-V semiconductor chip. A feature of the invention is a dual-gate FET formed using layers of semiconductor material deposited during fabrication of an HBT. An advantage of the invention is a III-V compound HBT-FET planar device fabricated using a mirror extension of the conventional HBT process.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

Figure 1:
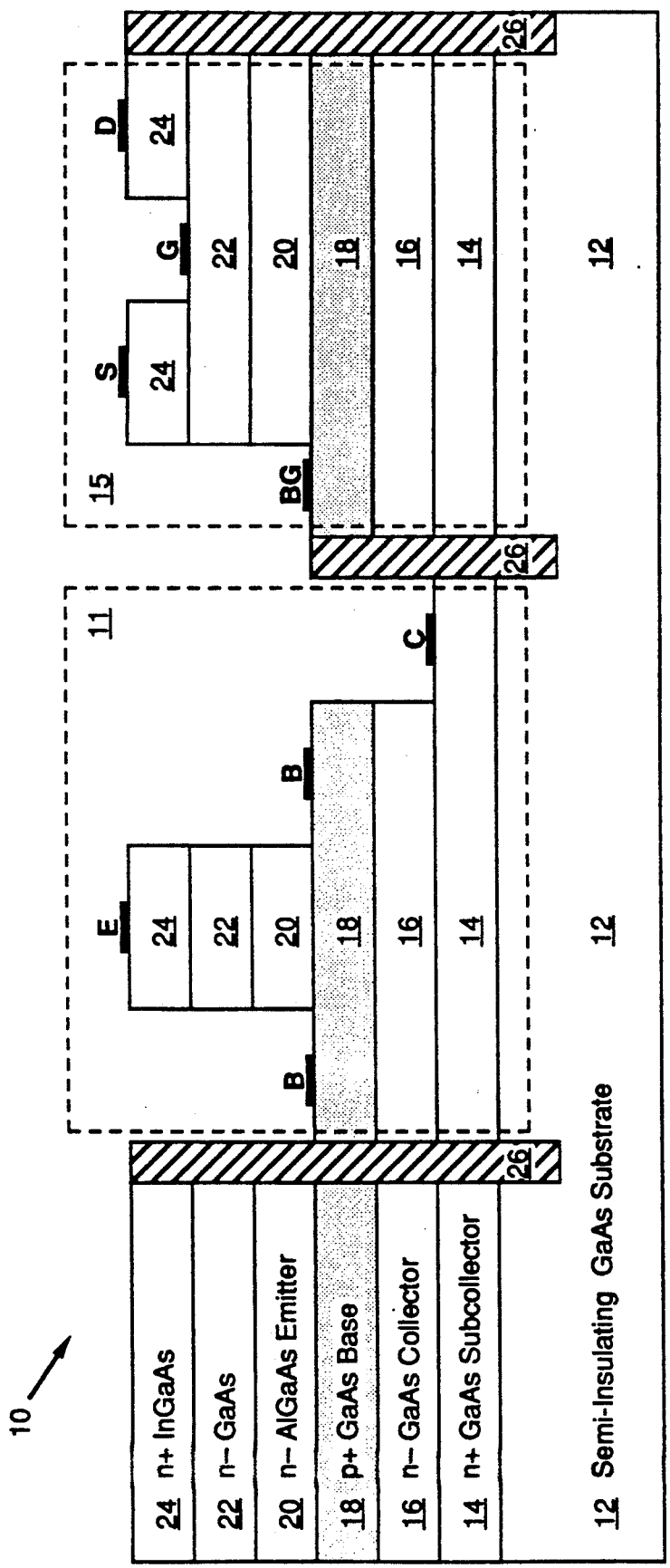
FIG. 1 is a schematic cross sectional diagram illustrating the epitaxial layer structure of an n-p-n GaAs planar HBT-FET device as an example of the present invention.

The present invention comprises a III-V compound planar device that integrates field effect transistors (FETs) with heterojunction bipolar transistors (HBTs) on the same semiconductor wafer. The device may be fabricated from III-V semiconductor materials such as GaAs, AlGaAs, InGaAs, InAlAs, and InP, for example. The HBT-FET device of the present invention (also termed a "BiFET") may comprise either an n-p-n HBT combined with an n-FET or a p-n-p HBT combined with a p-FET. A schematic cross section of the epitaxial layer structure of an n-p-n GaAs planer BiFET 10 is illustrated in FIG. 1 as an exemplary embodiment, but not a limitation, of the present invention.

BiFET 10 is fabricated on a semi-insulating GaAs substrate 12 as shown in FIG. 1. Conventional deposition, masking, and etching steps are used to fabricate an HBT 11 atop substrate 12 and then form a FET 15 using the semiconductor layers deposited for HBT 11. First, a heavily doped $n^+$ GaAs subcollector layer 14 is deposited atop substrate 12. A collector contact C, typically comprising a Au/Ge/Ni alloying contact, is deposited atop subcollector 14. A lightly doped $n^-$ GaAs collector layer 16 is deposited atop subcollector 14. A heavily doped $p^+$ GaAs base layer 18 is deposited atop collector layer 16. Base contacts B, typically comprising Ti/Pt/Au non-alloying contacts, are deposited atop base layer 18 as illustrated. A lightly doped $n^-$ AlGaAs emitter layer 20 is deposited atop base layer 18. A lightly doped $n^-$ GaAs emitter cap layer 22 is deposited atop emitter layer 20. A heavily doped $n^+$ InGaAs emitter contact layer 24 is deposited atop cap layer 22. An emitter contact E, typically comprising a Ti/Pt/Au non-alloying contact, is deposited atop contact layer 24. Thus, HBT 11, comprising an emitter, a base, and a collector, is formed in a conventional manner on substrate 12.

In BiFET 10 of the present invention, FET 15 is formed using the semiconductor material deposited during formation of emitter cap layer 22 and emitter contact layer 24. Source contact S and drain contact D of FET 15 are deposited on the heavily doped n+ InGaAs layer 24, as illustrated in FIG. 1. The gate of FET 15 is formed by etching through InGaAs layer 24 and depositing Schottky gate metal contact G on lightly doped n− GaAs layer 22 to form a MESFET. Gate contact G typically comprises a Ti/Pt/Au non-alloying contact. The gate recess can be formed with a timed etch (with current monitoring), or with use of an etch stop layer as is well known in the art. For current monitoring during fabrication of the gate/channel region, p+ base layer 18 is connected to an external bias or shorted to source contact S (thereby preventing accumulation of floating charge in layer 18) to obtain a well-defined threshold voltage and normal I-V characteristics in FET 15. The threshold voltage of FET 15 is determined by the thickness and doping concentration of n− GaAs layer 22 that forms the channel. The underlying n− AlGaAs layer 20, which is thin and fully depleted by the built-in voltage of the base/emitter heterojunction, does not contribute to the value of the threshold voltage. Thus, channel electron mobility is characteristic of GaAs rather than AlGaAs. For most digital and analog applications, the required threshold voltage values (e.g., in the range of −3.0 v to +0.2 v) can be accomplished by lowering the doping concentration of n− GaAs layer 22 from approximately $1 \times 10^{18}/cm^3$ to approximately $5 \times 10^{17}/cm^3$ and adjusting the channel thickness of layer 22 by gate recessing. The increase of emitter resistance in HBT 11 due to the decrease in doping is very small and does not impact the value of the overall emitter resistance.

The presence of heavily doped p+ GaAs layer 18 under the channel (layer 22) of FET 15 provides several desirable features. The p+ GaAs/n− AlGaAs heterojunction of layers 18 and 20 prevents short-channel effects and minimizes the increase of FET channel conductance induced by radiation and/or backgating. Minority carriers produced in the substrate 12 and collector layers 14 and 16 flow toward base layer 18 but not into layer 22: AlGaAs layer 20 provides an energy step in the valence band that prevents hole motion. Minority carriers (electrons) produced in base layer 18 flow toward the surface, but their contribution to excess channel conductance is minimal because base layer 18 is only on the order of 500 Å thick. Radiation hardening and backgating resistance of FET 15 can be further enhanced by introducing a back gate electrode BG (i.e., a p-n junction gate) for biasing heavily doped p+ GaAs layer 18. With back gate BG, FET 15 becomes a dual-gate FET comprising a front gate MESFET and a back gate p-n junction FET.

Back gate BG must be biased, either by connection to source S or an external power supply, to prevent accumulation of floating charge in base layer 18. When back gate BG is shorted to source S, transconductance of FET 15 is enhanced, and floating charge cannot accumulate to cause unwanted modulations of the threshold voltage and channel current that produce abnormal I-V characteristics in FET 15, particularly at low drain bias conditions. When back gate BG is connected to an external power supply, excess carriers generated by radiation, for example, are swept away into the power supply. With the use of back gate BG, therefore, undesirable long term transients and backgating effects, which are commonly seen in conventional GaAs MESFETs, can be greatly reduced. In addition, the threshold voltage of dual-gate FET 15 can be tuned by modulating the gate potential through back gate BG, and separate signals on front gate G and back gate BG can be combined for desirable effects in mixer-type applications.

A potential drawback of heavily doped p+ GaAs layer 18 under channel 22 of FET 15 is a detrimental increase in the drain-source capacitance and the feedback capacitance from drain to channel. Testing of BiFET 10 of the present invention, however, has shown that this capacitance is not excessive. More importantly, the structure of BiFET 10 is planar and fully compatible with the conventional HBT process. The typical fabrication process for BiFET 10 requires 15 mask layers, which includes 12 masks for fabrication of HBT 11 and 3 additional masks for fabrication of FET 15. Device isolation among the HBTs and FETs formed on substrate 12 is accomplished by areas of ion implantation 26, as illustrated in FIG. 1.

Although the present invention has been described with respect to specific embodiments thereof, various changes and modifications can be carried out by those skilled in the art without departing from the scope of the invention. As stated above, the present invention may comprise either n-p-n or p-n-p devices and may be fabricated of various III-V semiconductor compounds using known processing techniques. Therefore, it is intended that the present invention encompass such changes and modifications to the described embodiments as fall within the scope of the appended claims.

We claim:

1. A planar HBT-FET device, comprising:
   a semiconductor substrate;
   an HBT formed atop said substrate, said HBT having a collector comprising a collector layer of semiconductor material deposited atop said substrate, a base comprising a base layer of semiconductor material deposited atop said collector layer, and an emitter;
   said emitter comprising an emitter layer of semiconductor material deposited atop said base layer, an emitter cap layer of semiconductor material deposited atop said emitter layer, and an emitter contact layer of semiconductor material deposited atop said emitter cap layer;
   a FET formed from said layers of semiconductor material and isolated from said HBT;
   said FET having a source and a drain formed in said emitter contact layer, a gate recess in said emitter contact layer between said source and drain, and a Schottky gate metal contact deposited atop said emitter cap layer in said gate recess, said emitter cap layer forming a channel for said FET.

2. The planar HBT-FET device of claim 1, wherein said FET comprises a dual-gate FET having a back gate formed in said base layer.

3. The planar HBT-FET device of claim 2, wherein said dual-gate FET comprises a front gate MESFET and a back gate junction FET.

4. The planar HBT-FET device of claim 1, further comprising a subcollector layer of heavily doped semiconductor material of a first conductivity type deposited atop said substrate, and wherein said collector comprises a lightly doped semiconductor material of said first conductivity type deposited atop said subcollector layer, said base layer comprises a heavily doped semiconductor layer of a second conductivity type deposited atop said collector layer, said emitter layer comprises a lightly doped semiconductor layer of said first conductivity type deposited atop said base layer, said emitter cap layer comprises a lightly doped semiconductor layer of said first conductivity type deposited atop said emitter layer, and said emitter contact layer comprises a heavily doped semiconductor layer of said first conductivity type deposited atop said emitter cap layer.

5. The planar HBT-FET device of claim 1, wherein said HBT and said FET are isolated by areas of ion implantation.

6. A III-V compound planar HBT-FET device, comprising:
   a semi-insulating semiconductor substrate;
   an HBT formed atop said substrate, said HBT having a collector comprising a collector layer of semiconductor material of a first conductivity type deposited atop said substrate, a base comprising a base layer of semiconductor material of a second conductivity type deposited atop said collector layer, and an emitter comprising an emitter layer of semiconductor material of said first conductivity type deposited atop said base layer;
   a lightly doped emitter cap layer comprising semiconductor material of said first conductivity type deposited atop said emitter layer, and a heavily doped emitter contact layer comprising semiconductor material of said first conductivity type deposited atop said emitter cap layer;
   a FET formed atop said substrate from said layers of semiconductor material and isolated from said HBT;
   said FET having a source and a drain formed in said heavily doped emitter contact layer, a gate recess in said emitter contact layer between said source and drain, and a Schottky gate metal contact deposited atop said lightly doped emitter cap layer in said gate recess, said emitter cap layer forming a channel for said FET.

7. The planar HBT-FET device of claim 6, wherein said base layer comprises heavily doped semiconductor material of said second conductivity type deposited atop said collector layer, said heavily doped base layer forming a back gate for said FET.

8. The planar HBT-FET device of claim 7, wherein said FET is a dual-gate FET comprising a front gate MESFET and a back gate junction FET.

9. The planar HBT-FET device of claim 8, wherein said HBT and said FET are isolated by areas of ion implantation.

10. A III-V semiconductor compound planar HBT-FET device, comprising:
    a semi-insulating III-V semiconductor compound substrate;
    a heavily doped subcollector layer of a first conductivity type deposited atop said substrate;
    a lightly doped collector layer of said first conductivity type deposited atop said subcollector layer;
    a heavily doped base layer of a second conductivity type deposited atop said collector layer;
    a lightly doped emitter layer of said first conductivity type deposited atop said base layer;
    a lightly doped emitter cap layer of said first conductivity type deposited atop said emitter layer;
    a heavily doped emitter contact layer of said first conductivity type deposited atop said emitter cap layer;
    an HBT formed from said doped layers, said HBT further comprising an emitter contact deposited atop said emitter contact layer, a base contact deposited atop said base layer, and a collector contact deposited atop said subcollector layer;
    a FET formed from said doped layers and isolated from said HBT, said FET further comprising a source contact and a drain contact deposited atop said emitter contact layer, and a Schottky gate metal contact recessed between said source and drain contacts and deposited atop said emitter cap layer, said emitter cap layer forming a channel for said FET; and
    areas of ion implantation extending through said doped layers to isolate said HBT and said FET.

11. The III-V semiconductor compound planar HBT-FET device of claim 10, further comprising a back gate contact deposited atop said heavily doped base layer to form a back gate for said FET.

12. The III-V semiconductor compound planar HBT-FET device of claim 11, wherein said FET is a dual-gate FET comprising a front gate MESFET and a back gate junction FET.

13. The III-V semiconductor compound planar HBT-FET device of claim 12, wherein said subcollector layer comprises heavily doped GaAs, said collector layer comprises lightly doped GaAs, said base layer comprises heavily doped GaAs, said emitter layer comprises lightly doped AlGaAs, said emitter cap layer comprises lightly doped GaAs, and said emitter contact layer comprises heavily doped InGaAs for supporting non-alloying contacts on said emitter contact layer.

* * * * *